United States Patent
Ito

(10) Patent No.: US 7,943,946 B2
(45) Date of Patent: May 17, 2011

(54) LIGHT EMITTING DEVICE

(75) Inventor: Shin Ito, Mihara (JP)

(73) Assignee: Sharp Kabushiki Kaisha, Osaka-shi (JP)

(*) Notice: Subject to any disclaimer, the term of this patent is extended or adjusted under 35 U.S.C. 154(b) by 636 days.

(21) Appl. No.: 11/603,722

(22) Filed: Nov. 21, 2006

(65) Prior Publication Data

US 2007/0114514 A1 May 24, 2007

(30) Foreign Application Priority Data

Nov. 21, 2005 (JP) ................................. 2005-336402
Nov. 21, 2005 (JP) ................................. 2005-336403

(51) Int. Cl.
*H01L 33/00* (2010.01)
(52) U.S. Cl. .................. 257/98; 257/E33.067; 438/106; 438/124
(58) Field of Classification Search ............ 257/97–100, 257/13, 687, 730, E33.067; 362/327; 438/106, 438/116, 121, 124, 127
See application file for complete search history.

(56) References Cited

U.S. PATENT DOCUMENTS

| | | | | |
|---|---|---|---|---|
| 5,813,753 | A * | 9/1998 | Vriens et al. ................... | 362/293 |
| 6,495,861 | B1 | 12/2002 | Ishinaga | |
| 6,547,416 | B2 | 4/2003 | Pashley et al. | |
| 6,679,621 | B2 * | 1/2004 | West et al. ..................... | 362/327 |
| 7,042,021 | B2 * | 5/2006 | Isoda .............................. | 257/98 |
| 7,296,916 | B2 * | 11/2007 | Ouderkirk et al. ............. | 362/373 |
| 7,344,902 | B2 * | 3/2008 | Basin et al. ..................... | 438/27 |
| 7,473,013 | B2 * | 1/2009 | Shimada ........................ | 362/327 |
| 7,473,937 | B2 * | 1/2009 | Park et al. ..................... | 257/98 |
| 2001/0032985 | A1 * | 10/2001 | Bhat et al. ..................... | 257/88 |
| 2002/0080622 | A1 | 6/2002 | Pashley et al. | |
| 2003/0107316 | A1 * | 6/2003 | Murakami et al. ............. | 313/512 |
| 2004/0051111 | A1 * | 3/2004 | Ota et al. ....................... | 257/98 |
| 2005/0105880 | A1 * | 5/2005 | Randall ......................... | 385/147 |
| 2005/0218421 | A1 * | 10/2005 | Andrews et al. ............... | 257/100 |
| 2005/0254243 | A1 * | 11/2005 | Jiang et al. .................... | 362/249 |
| 2006/0050526 | A1 | 3/2006 | Ikeda et al. | |
| 2006/0163602 | A1 | 7/2006 | Isokawa | |

FOREIGN PATENT DOCUMENTS

CN 1404564 A 3/2003

(Continued)

*Primary Examiner* — Thao X Le
*Assistant Examiner* — William F Kraig
(74) *Attorney, Agent, or Firm* — Morrison & Foerster LLP

(57) ABSTRACT

A light emitting device includes: a light emitting element; and a substantially rectangular package body in which the light emitting element is contained and a concave portion is formed. The concave portion has a bottom surface on which the light emitting element is disposed, and is filled with a transparent sealing resin for covering the light emitting element. Further, the sealing resin has a surface serving as an emitting surface, from which light is extracted. The package body includes: a reflection surface being an inclined plane provided along a short side of a depressed region toward the emitting surface, when seen from above the emitting surface; and a die bonding region and a wire bonding region on a bottom surface of the depressed region. Further, the depressed region has a depth being substantially equal to or less than a height of the active layer of the light emitting element.

9 Claims, 9 Drawing Sheets

FOREIGN PATENT DOCUMENTS

| | | |
|---|---|---|
| JP | 63-152179 | 6/1988 |
| JP | 11-317546 | 11/1999 |
| JP | 2000-269551 A | 9/2000 |
| JP | 2001-201719 | 7/2001 |
| JP | 2004-158830 A | 6/2004 |
| JP | 2004-516666 A | 6/2004 |
| JP | 2004-193537 A | 7/2004 |
| JP | 2005175389 A * | 6/2005 |
| WO | WO-02/50472 A1 | 6/2002 |
| WO | WO-2004/112155 A1 | 12/2004 |

* cited by examiner

EMISSION CHARACTERISTICS IN SHORT AXIS DIRECTION

EMISSION CHARACTERISTICS IN LONG AXIS DIRECTION

EMISSION CHARACTERISTICS IN SHORT AXIS DIRECTION

EMISSION CHARACTERISTICS IN LONG AXIS DIRECTION

LIGHT EMITTING DEVICE

This Nonprovisional application claims priority under 35 U.S.C. §119(a) on Patent Applications No. 336402/2005 and 336403/2005 both filed in Japan on Nov. 21, 2005, the entire contents of which are hereby incorporated by reference.

FIELD OF THE INVENTION

The present invention relates to a light emitting device including a light emitting element and a package body which contains the light emitting element and in which a concave portion having a reflector function for extracting light to the outside is formed.

BACKGROUND OF THE INVENTION

As a thin plane light source used in liquid crystal displays, for example, there has been a surface mount light emitting device (hereinafter referred to as light emitting device), which is disposed on an edge surface of an optical waveguide provided on a bottom surface of a liquid crystal display unit.

In the plane light source, the optical waveguide and the light emitting device are provided so that the edge surface of the optical waveguide faces an emitting surface of the light emitting device.

Light emitted from the plane light source is incident on the edge surface of the optical waveguide, and emitted from a top plane surface of the optical waveguide.

For example, Japanese Unexamined Patent Publication 193537/2004 (Tokukai 2004-193537, publication date: Jul. 8, 2004) (Patent Document 1) discloses a light emitting device used in such a plane light source. The light emitting device disclosed in this publication includes a reflector for causing light to be efficiently incident on an edge surface of an optical waveguide.

The light emitting device includes a package body having a concave portion, which contains an LED chip (hereinafter referred to as chip) and in which a concave portion for extracting light to the outside is formed. The concave portion serves as a reflector formed in a flat shape and having an opening enlarged toward the edge surface of the optical waveguide.

The reflector (concave portion) has a bottom surface, on which a chip is mounted, and a side wall. The side wall is provided along an outer edge of the bottom surface so as to form an angle with the bottom surface. Further, the reflector is formed so that light is emitted in parallel to a mounting surface.

On the bottom surface of the concave portion, a die bonding region is provided in its substantially center part. Further, portions in the vicinity of both sides of the die bonding region are wire bonding regions, where electrodes for supplying an electric power are disposed in parallel.

The chip is mounted in the die bonding region, and connected to the electrodes with wires. Further, the concave portion is filled with a transparent sealing resin, a surface of which serves as the emitting surface.

Further, there have been light emitting devices that improve light extraction efficiency by suppressing a total reflection at a boundary between a sealing resin in a chip and air. One such light emitting device is described in, for example, Japanese Unexamined Patent Publication 516666/2004 (Tokuhyo 2004-516666), i.e., WO2002/050472 (international publication date: Jun. 27, 2002) (Patent Document 2).

The light emitting device described in this publication includes a chip; a polygon shape bottom surface on which the chip is mounted, a horn shape reflector, and a resin with which the chip is sealed. The reflector has a side wall provided with an angle along the outer edge of the bottom surface. The side wall of the reflector has a gentle slope surface and a steep slope surface, which are provided in this order from the bottom surface. Further, the reflector is filled with a sealing resin up to a level that sufficiently suppresses a total reflection from occurring at the boundary between a sealing resin and air.

However, the light emitting device described in Patent Document 1 merely includes a reflector having a single slope surface.

Further, the light emitting device described in Patent Document 2 includes a horn shape reflector, which has a polygon shape bottom surface including a gentle slope surface and a steep slope surface. Further, the reflector described in Patent Document 2 is filled with a resin up to a level that sufficiently suppresses the total reflection.

On the other hand, as a chip having a high intensity and high efficiency in light emission, there has been a known chip (element) that has emission characteristics of achieving a peak light intensity in a direction along a side of the chip. One such chip is, for example, an element which has a side surface inclined from its bottom surface to its top surface, and which includes an active layer in the vicinity of the bottom surface. However, in the reflector having the side surface described in Patent Document 1 and in the reflector having the gentle slope surface described in Patent Document 2, an active layer is provided in the vicinity of a bottom surface. Thus, in these reflectors, no consideration is mainly given to a situation where components of light emitted from a side surface of a chip can be reflected.

On the contrary, there has also been a chip that includes a light emitting section, i.e., active layer, provided at a position between the substantially center part of a chip and the vicinity of a top surface of the chip.

Further, in the reflector having the side surface described in Patent Document 1 and in the reflector having the gentle slope surface described in Patent Document 2, no consideration is given to a situation where a tilt angle is formed such that components of light emitted from a chip including an active layer between its substantially center part and the vicinity of its top surface is reflected efficiently.

Thus, in the light emitting devices described in these publications, light extraction efficiency has not been sufficient when such a chip is used.

Further, in the light emitting device described in Patent Document 1, the side wall of the reflector is merely made close to the vicinity of the chip. This narrows the area for the wire bonding region, causing difficulties in performing wire bonding.

Further, since the die bonding region is narrow, it has been difficult to mount a chip being large in size and emitting large mount of light.

Further, the light emitting device described in Patent Document 2 does not consider to provide a thin light emitting devices by forming the reflector in a compressed shape.

SUMMARY OF THE INVENTION

In view of the foregoing problems, the present invention has an object of providing a light emitting device, which has a thin body and achieves high light extraction efficiency.

Further, in view of the foregoing problems, the present invention has an object of providing a light emitting device, which has a thin body including a large wire bonding region and a large die bonding region, and which achieves high light extraction efficiency.

According to the present invention, to attain the above object, there is provided a light emitting device including: a light emitting element; and a package body in which the light emitting element is contained and a concave portion is provided, the concave portion, having a bottom surface on which the light emitting element is disposed, is filled with a transparent sealing resin for covering the light emitting element, the sealing resin having with air a boundary serving as an emitting surface from which light is extracted, the light emitting element including an active layer provided in the vicinity of its bottom surface, and emitting light so as to achieve, as an emission characteristic, a strong peak intensity in a direction along a side surface of the light emitting element, and the concave portion having a reflection surface including a gentle slope surface and a steep slope surface, which are provided in this order from the bottom surface of the concave portion.

According to the arrangement, components of the light emitted mainly from the side surface of the chip are reflected by the gentle slope surface of a reflector, and incident on the emitting surface, i.e., the boundary between the sealing resin and air causing no total reflection at the emitting surface. This enables the light to be extracted efficiently. Further, by providing the steep slope surface from a certain point of the gentle slope surface, the package is realized in a thin body.

As a result, the light emitting device is provided which is excellent in efficiently extracting light emitted from the chip, regardless of such a thin body.

Further, according to the present invention, to attain the above object, there is provided a light emitting device including: a light emitting element; and a substantially rectangular package body in which the light emitting element is contained and a concave portion is formed, the concave portion having a bottom surface on which the light emitting element is disposed, and being filled with a transparent sealing resin for covering the light emitting element, the sealing resin having a surface serving as an emitting surface, from which light is extracted, the light emitting element including an active layer at a position between the substantially center part of the light emitting element and the vicinity of a top surface of the light emitting element, the package body including: a depressed region in the concave portion; a reflection surface being an inclined plane provided along a short side of the depressed region toward the emitting surface, when seen from above the emitting surface; and a die bonding region and a wire bonding region on a bottom surface of the depressed region, the depressed region having a depth being substantially equal to or less than a height of the active layer of the light emitting element.

According to the arrangement, the light emitting device employs a chip including the active layer provided at a certain height from the bottom of the chip. In the light emitting device, the wire bonding region can be enlarged by providing the depressed region in the concave portion. This allows use of a chip in which wire bonding is easily performed and which is large in size and in light volume.

Further, among components of light emitted from the chip including the active layer provided between the substantially center part of the chip and the vicinity of a top surface of the chip, most components of light emitted at least from portion(s) between the active layer and the top surface are reflected by the slope surface of the reflector. This enables the light to be extracted efficiently.

As a result, a light emitting device is provided which is excellent in efficiently extracting light emitted from the chip, regardless of such a thin body.

Additional objects, features, and strengths of the present invention will be made clear by the description below. Further, the advantages of the present invention will be evident from the following explanation in reference to the drawings.

DESCRIPTION OF THE EMBODIMENTS

First Embodiment

Figure 1:
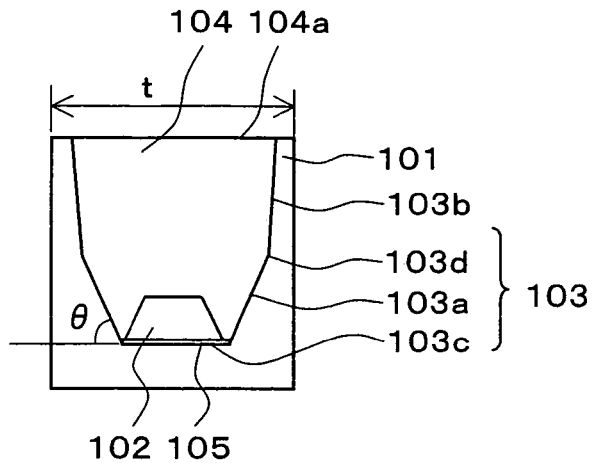
FIG. 1(a) is a cross sectional view taken in a short axis direction of a light emitting device according to an embodiment of the present invention.
FIG. 1(b) is a cross sectional view taken in a long axis direction of the light emitting device according to the embodiment of the present invention.
FIG. 1(c) is a plan view of the light emitting device, seen from over an emitting surface of the light emitting device according to the embodiment of the present invention.
Figure 1:
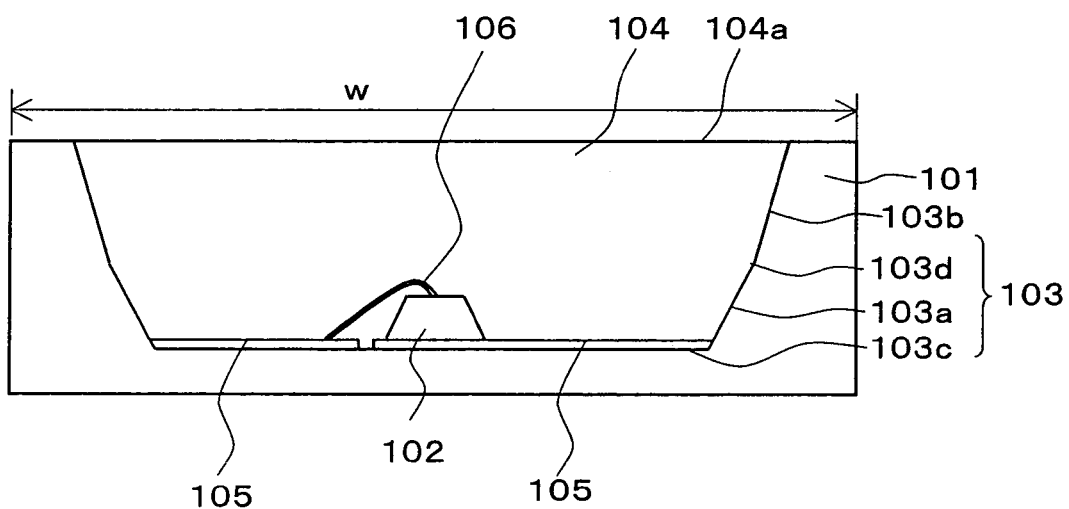
Figure 1:
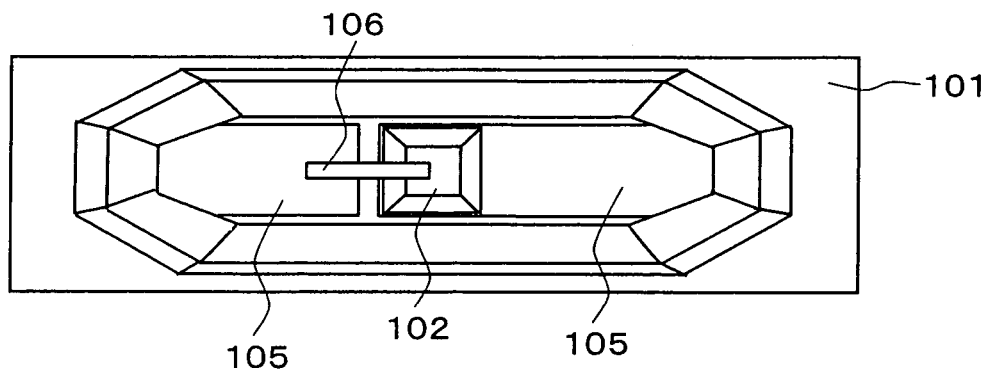
Figure 2:
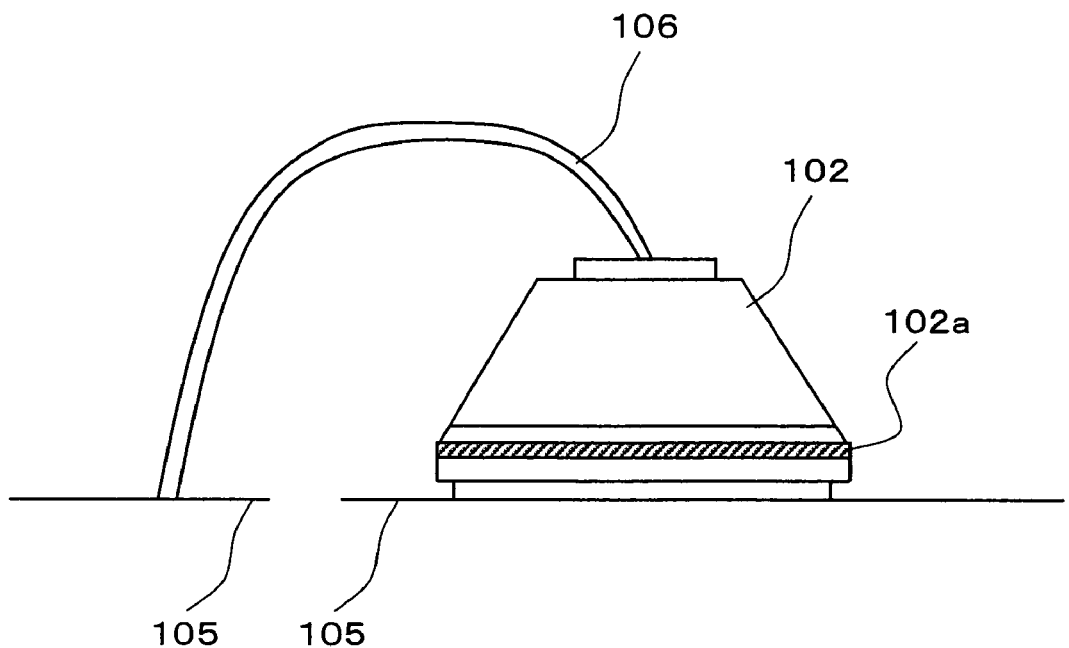
FIG. 2(a) is a cross sectional view of a chip according to the embodiment of the present invention.
FIG. 2(b) is a view showing emission characteristics of the chip according to the embodiment of the present invention.
Figure 2:
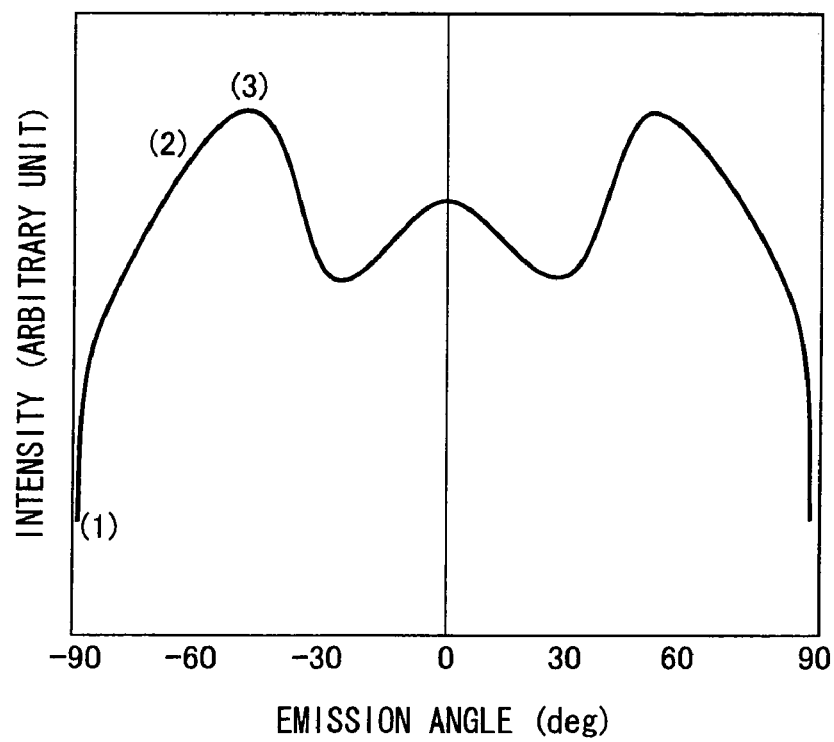

Referring to FIGS. 1 through 4, the following describes an embodiment of a light emitting device according to the present invention.

FIG. 1(a) is a cross-sectional view of the light emitting device according to the present embodiment.

The light emitting device includes: a substantially rectangular package body (hereinafter referred to as package 101) having a dish-shaped concave portion; and an LED chip (hereinafter referred to as chip 102) shown in FIG. 2(a).

The concave portion constitutes a reflector 103 having a bottom surface 103c and a side wall provided with an angle along an outer edge of the bottom surface. In order to have a reflector function, the reflector 103 may utilize reflection characteristics of the package 101 itself in a case where the package 101 is constituted by a white package, or may separately process a side wall of the concave portion so as to improve reflectivity of the concave portion. For example, a reflective film may be formed on the side wall of the concave portion.

In the cross section in a short-axis direction of the light emitting device shown in FIG. 1(a), the reflector 103 is formed such that the side wall has a gentle slope surface 103a and a steep slope surface 103b, which are provided in this order from the bottom surface 103c toward an emitting surface 104a.

The gentle slope surface 103a is formed so as to have a tilt angle θ of not greater than 66° with respect to the bottom surface 103c. Further, the steep slope surface 103b is formed so as to have a tilt angle of, for example, 88°.

The chip 102 is provided in the substantially center part of the bottom surface 103c.

The bottom surface 103c has thereon electrodes 105 for supplying an electric power to the chip 102. The electrodes 105 are electrically connected to the chip 102 with a wire 106.

Further, the concave portion is filled with a transparent sealing resin 104.

Note that, the sealing resin 104 may contain a phosphor for converting a light emitting wavelength of the chip 102.

Further, a boundary between the sealing resin 104 and air serves as the emitting surface 104a.

The shape of the emitting surface 104a seen from the top view of FIG. 1(c) is not limited to a rectangle, and may be a polygon or ellipse.

Further, it is preferable that the emitting surface 104a be substantially plane. This enables an incident angle θi (described later) to be more accurate, thereby improving light extraction efficiency.

Note that, FIG. 1(b) is a cross sectional view taken in a long axis direction of the light emitting device, and FIG. 1(c) is its plane view seen from over the emitting surface 104a.

FIG. 2(a) is a cross sectional view of the chip 102, and FIG. 2(b) is a view showing emission characteristics of the chip 102. Each emission angle indicates an angle formed with normal to the chip 102.

The chip 102, formed in a truncated pyramid for example, has a side surface being inclined from its bottom surface to its top surface. The chip 102 includes a light emitting section, i.e., an active layer 102a, formed at a position closer to the bottom surface of the chip 102 than to the substantially center part of the chip 102. Normally, the active layer 102a is formed in parallel to the bottom surface of the chip 102.

With such a structure, the chip 102 improves efficiency of extracting light emitted from the chip and transmitted through the sealing resin 104. In this case, particularly, light emitted from the side surface of the chip 102 with an emission angle of 40° to 60° achieves a peak intensity.

Figure 3:
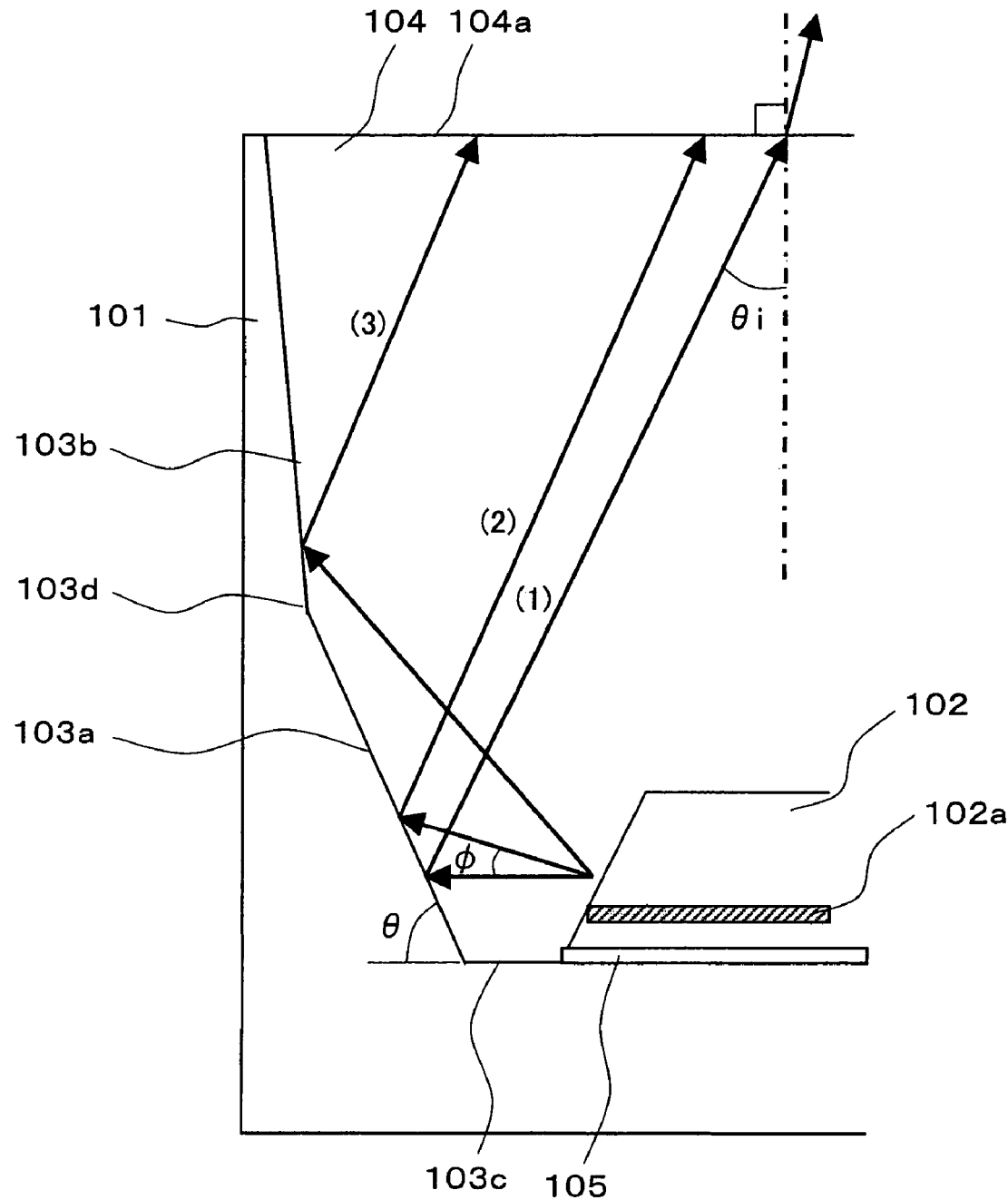
FIG. 3 is a view showing optical paths of the light emitting device according to the embodiment of the present invention.
Figure 4:
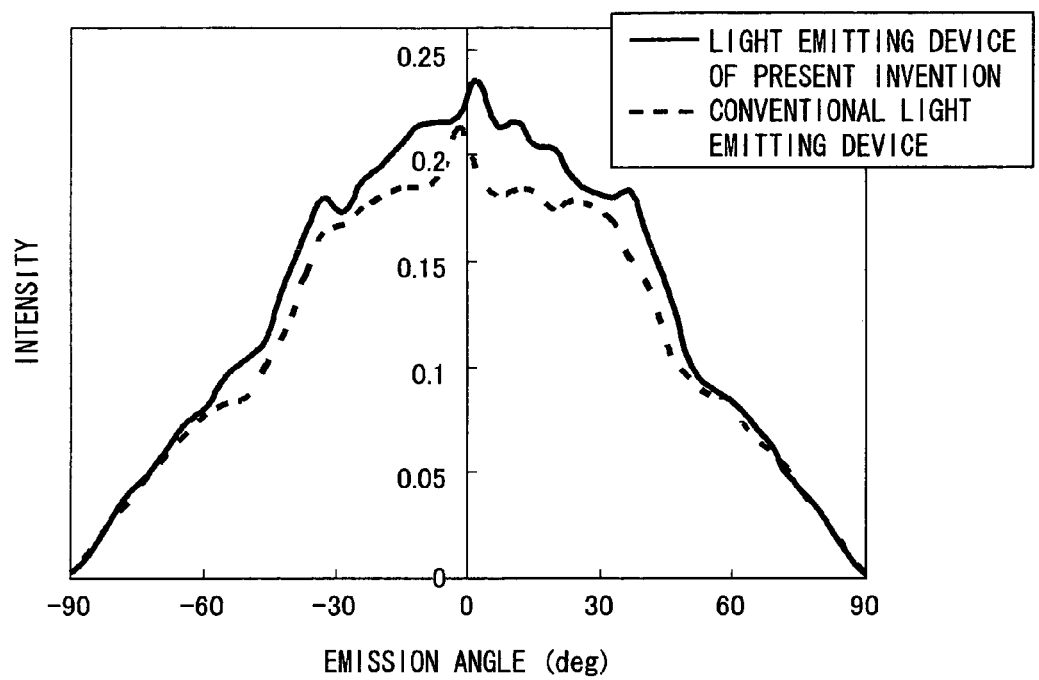
FIG. 4(a) is a view showing emission characteristics of light emitting devices in their short axis direction, based on comparison made with regard to intensity between the light emitting device according to the embodiment of the present invention and a conventional light emitting device.
FIG. 4(b) is a view showing emission characteristics of light emitting devices in their long axis direction, based on comparison made with regard to intensity between the light emitting device according to the embodiment of the present invention and the conventional light emitting device.
Figure 4:
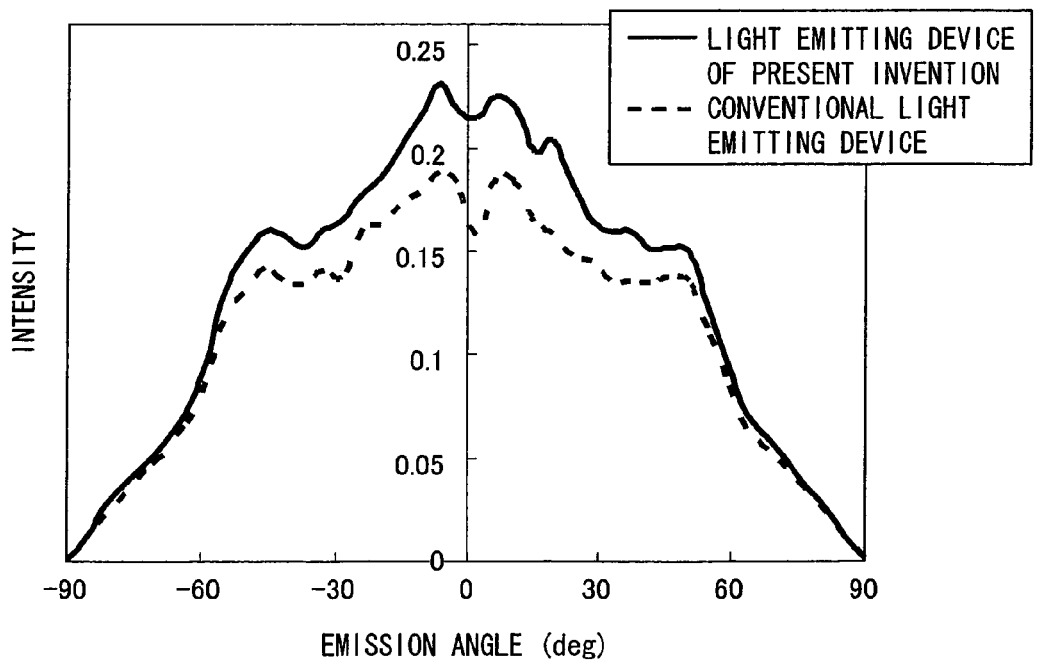
Figure 5:
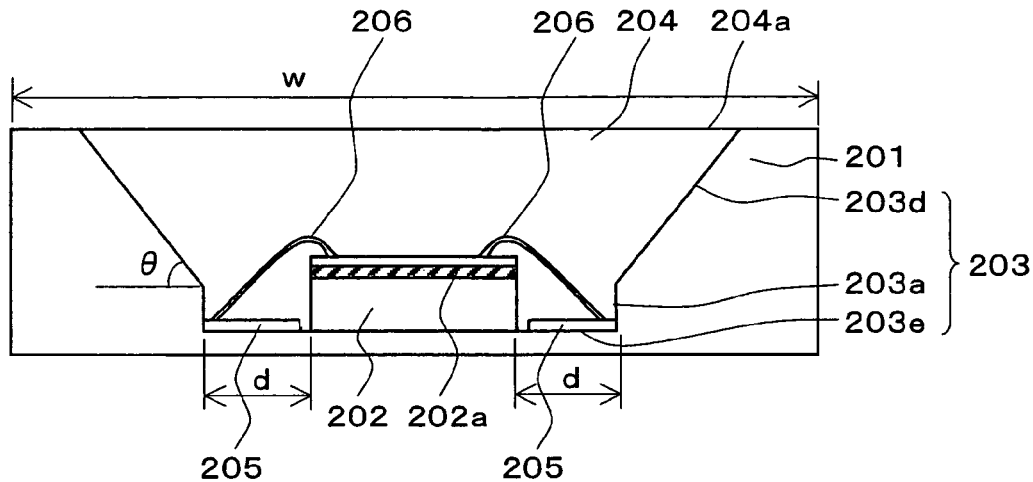
FIG. 5(a) is a cross sectional view taken in a long axis direction of a light emitting device according to another embodiment of the present invention.
FIG. 5(b) is a cross sectional view taken in a short axis direction of the light emitting device according to another embodiment of the present invention.
FIG. 5(c) is a plan view of the light emitting device, seen from over an emitting surface of the light emitting device according to another embodiment of the present invention.
Figure 5:
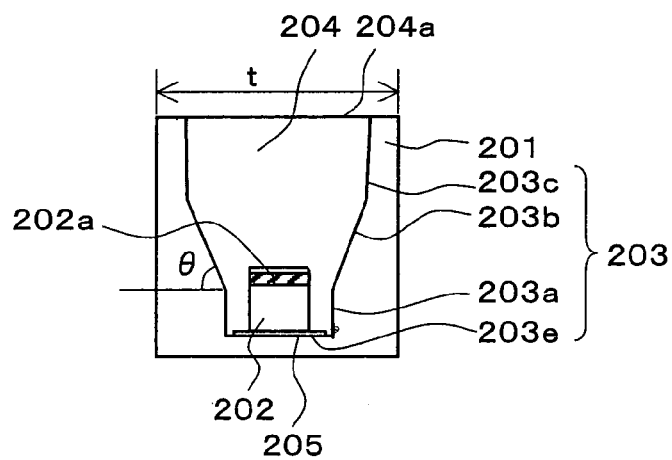
Figure 5:
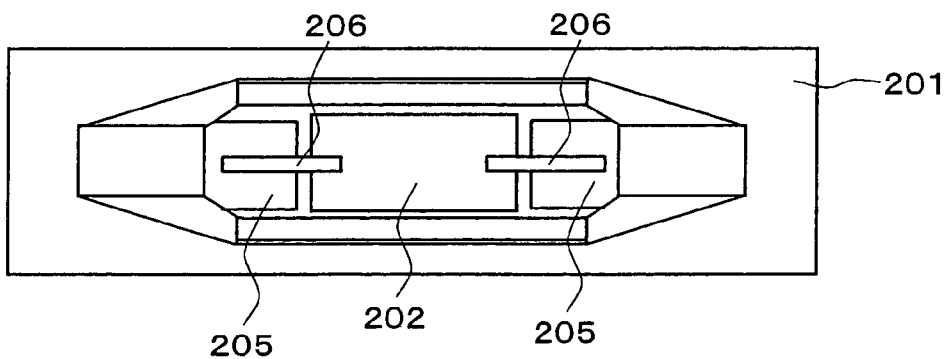
Figure 6:
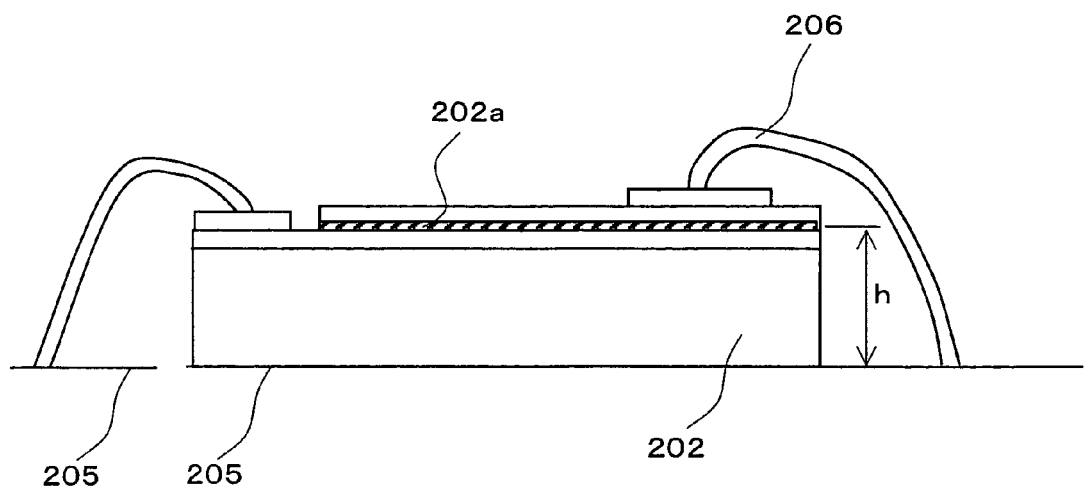
FIG. 6(a) is a cross sectional view of a chip according to another embodiment of the present invention.
FIG. 6(b) is a view showing emission characteristics of the chip according to another embodiment of the present invention.
Figure 6:
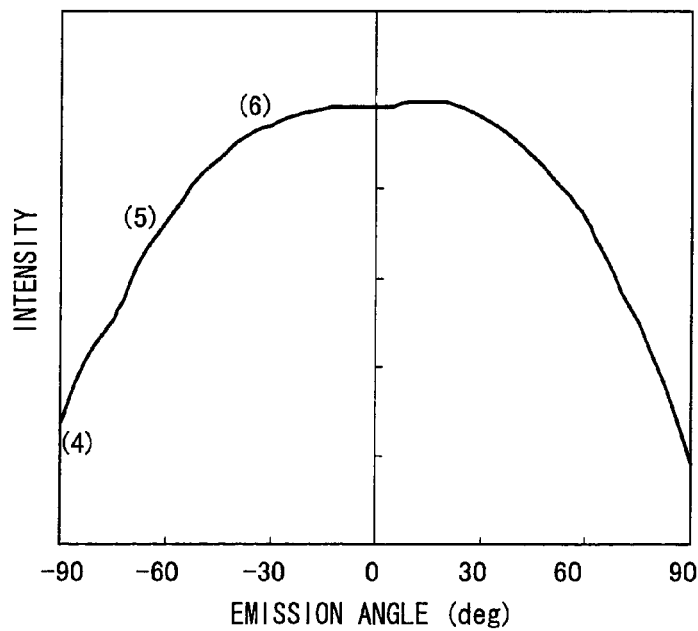

FIG. 3 is a view showing optical paths of the light emitting device according to the present embodiment.

Note that, FIG. 3 is an enlarged view of one side of the side wall of the reflector 103. It is obvious that the same principle is applied to another side of the side wall.

Light emitted mainly from the side surface of the chip 102 is reflected by the reflector 103, incident on the emitting surface 104a with an incident angle θi, and emitted to air.

In a case where light propagates from a medium with a high refractive index to a medium with a low refractive index, if the incident angle θi is greater than a certain angle, total reflection of the light occurs at the boundary between the mediums. The angle of the total reflection is called a critical angle.

Thus, as the incident angle formed with the boundary of the mediums approaches a vertical angle with respect to the boundary, the reflection becomes minimum, enabling the light extraction efficiency to be maximum.

The sealing resin 104 has a refractive index n of about 1.5 when the sealing resin 104 is made of a material commonly used in this field. When a refractive index n of air is set to 1, the critical angle is about 42°. That is, when the incident angle θi is not greater than about 42°, the total reflection becomes minimum, enabling the light extraction efficiency to be maximum.

Referring to FIG. 3, the following describes optical paths (1) through (3) of light emitted from the side surface of the chip 102. In the following description, an elevation angle formed between each optical path and the active layer 102a is φ.

Note that, the optical paths (1) through (3) correspond to emission characteristics (1) through (3) of light having intensities shown in FIG. 2(b).

Thus, the optical path (1) is a path for light emitted with an elevation angle φ of about 0, i.e., when the light is emitted in substantially parallel to the active layer 102a. In other words, the light propagating in the optical path (1) corresponds to light emitted with an emission angle of 90° shown in FIG. 2(b).

In this case, the light is reflected by the gentle slope surface 103a, and incident on the emitting surface 104a with an incident angle θi of not greater than about 42°. This causes the total reflection at the emitting surface 104a to be minimum.

The optical path (2) is a path for light emitted with a moderate elevation angle, i.e., an emission angle of about 70°.

In this case, the light is reflected by the gentle slope surface 103a with a more moderate angle than an angle formed by the optical path (1). This causes the incident angle θi of the optical path (2) to be shallower than that of the optical path (1). Thus, no total reflection occurs also in this case.

The optical path (3) is a path for light emitted with a sharper elevation angle than an angle formed by the optical path (2), i.e., an emission angle of about 40°.

In this case, although the light is reflected by the steep slope surface 103b, it is possible for most components of the light to be incident on the emitting surface 104a with an incident angle θi of not greater than about 42°. This causes almost no total reflection also in this case.

In a case where the light is emitted with a further sharper elevation angle, i.e., an emission angle of not greater than about 40°, the light is either reflected by the steep slope surface 103b or directly incident on the emitting surface 104a. In either case, the incident angle θi can be set to be not greater than about 42°, causing almost no total reflection.

As such, in the reflector 103 having the gentle slope surface 103a and the steep slope surface 103b, most components of the light emitted from the chip 102 with an emission angle ranging from 0° to 90° are guided so as to be incident on the emitting surface 104a with an incident angle θi of not greater than about 42°.

Thus, in the chip 102 which has the side wall being inclined from its bottom surface to its top surface and which includes the active layer 102a provided in the vicinity of the bottom surface, it is possible to efficiently guide components of light emitted from the side surface of the chip with an emission angle in the ranging from 40° to 60° and achieving a peak intensity.

Note that, the tilt angle θ of the gentle slope surface 103a is not limited to an angle of not greater than 66°, and should be suitably adjusted according to the refractive index of the sealing resin 104. That is, it is only required, when light emitted mainly from the side surface of the chip 102 is reflected by the gentle slope surface 103a and incident on the emitting surface 104a with an incident angle θi, that the incident angle θi is not greater than the critical angle and no total reflection occurs.

Since the gentle slope surface 103a reflects light mainly emitted from the side surface of the chip 102, it is preferable that an interface 103d be provided at a point closer to the emitting surface 104a than to the top surface of the chip 102. Further, the interface 103d may have a smooth (curved) surface.

On the other hand, in the short axis direction, if the side wall of the reflector 103 is constituted by only a gentle slope surface, the package 101 has an increased thickness t. However, by setting the side wall to have a steep slope surface from a certain point as described above, it is possible to cause components of the light emitted with a moderate elevation angle to be incident on the emitting surface 104a without causing the total reflection. With the above structure, the package 101 is made more flat than the reflector 103, realizing a reduction in thickness of the package 101.

Further, as indicated by the optical path (3) shown in FIG. 3, the steep slope surface 103b also serves to efficiently guide and direct to the emitting surface 104a components of light emitted from the side surface of the chip 102 and components of light emitted from the top surface of the chip 102.

The sharper tilt angle the steep slope surface 103b forms, the less thickness t can be set. In this case, however, since the incident angle θi formed with the emitting surface 104a is increased, more components of the light are totally reflected, with the result that efficiency of guiding the light is deteriorated. Further, more components of the light are incident again on a steep slope surface facing the steep slope surface 103b, degrading efficiency of guiding the light. Considering such problems, it is important to form the steep slope surface 103b to have a tilt angle providing a good balance between the thickness t and the efficiency of guiding the light.

Note that, in the long axis direction of the reflector 103, the package 101 has a width w being substantially larger than the thickness t. This allows a large design margin.

Thus, in the long axis direction, the side wall of the reflector 103 may be constituted by a single inclined plane forming a tilt angle of not greater than 66°, or by a gentle slope surface and a steep slope surface as in the case with the short axis direction.

In the following, comparison is made with regard to emission characteristics between (i) a conventional light emitting device including a reflector having a side wall forming a single angle of 80° with a bottom surface of the reflector and (ii) the light emitting device according to the present embodiment. As is the case with the chip according to the present embodiment, a chip of the conventional light emitting device is formed in a pyramid, and includes an active layer provided in the vicinity of a bottom surface of the chip. Further, light emitted from a side surface of the chip achieves a peak intensity.

FIGS. 4(a) and 4(b) show results of the comparisons made with regard to intensity between (i) the light emitting device according to the present embodiment and (ii) the conventional light emitting device. FIGS. 4(a) and 4(b) show characteristics in light emission in the short axis direction and in the long axis direction, respectively. Compared with the conventional light emitting device, the light emitting device according to the present embodiment improves intensity of light emitted within the entire emission angle, compared to that of the conventional light emitting device.

Second Embodiment

Referring to FIGS. 5 through 9, the following describes another embodiment of a light emitting device according to the present invention.

FIG. 5(a) is a cross sectional view of the light emitting device according to the present embodiment.

The light emitting device includes: a rectangular package body having a dish-shaped concave portion (hereinafter referred to as package 201); and a chip 202 having a light emitting section, i.e., an active layer, formed in the vicinity of a top surface of the chip 202 as shown in FIG. 5(a) (hereinafter referred to as junction up chip).

The concave portion constitutes a reflector 203 having a depressed region and an inclined plane provided along an edge of the depressed region.

The depressed region has a bottom surface 203e and a vertical plane 203a provided along an outer edge of the 203e so as to be substantially vertical to the bottom surface 203e.

The depressed region has a depth being substantially equivalent to or less than a height h of the active layer 202a of the chip 202 shown in FIG. 6(a).

In order to have a reflector function, the reflector 203 may utilize reflection characteristics of the package 201 itself in a case where the package 201 is constituted by a white package, or may separately process an inner surface of the concave portion so as to improve reflectivity of the concave portion. For example, a reflective film may be formed on the surface of the concave portion.

In the cross sectional view taken in a long-axis direction of the light emitting device shown in FIG. 5(a), the reflector 203 has a side wall having a gentle slope surface 203d provided from an edge of the vertical plane 203a of the depressed region (i.e., from the short side of the depressed region, when seen from above an emitting surface 204a as shown in FIG. 5(c)) toward an emitting surface 204a.

The gentle slope surface 203d is formed so as to have a tilt angle θ of not greater than 66° with respect to the bottom surface 203e in the depressed region (the reason will be described later).

In the cross sectional view taken in a short axis direction of the light emitting device shown in FIG. 5(b), the reflector 203 is formed such that the side wall has the gentle slope surface 203b and the steep slope surface 203c, which are provided in this order from an edge of the vertical plane 203a (i.e., from the long side of the depressed region, when seen from above the emitting surface 204a as shown in FIG. 5(c)) of the depressed region toward the emitting surface 204a.

The gentle slope surface 203b is formed so as to have a tilt angle θ of not greater than 66° with respect to the bottom surface 203e of the depressed region (the reason will be described later).

Further, the steep slope surface 203c is formed so as to have a tilt angle of, for example, about 88°.

In the bottom surface 203e of the depressed region, the substantially center part serves as a die bonding region where the chip 202 is disposed. Further, on both sides of the die bonding region are provided wire bonding regions where electrodes 205 are disposed in parallel in the long axis direction. Each of the wire bonding regions has a width d. In order to facilitate wire bonding, preferably, the width d is ensured to be not less than 300 μm.

The electrodes 205 for supplying an electric power to the chip 202 are electrically connected to the chip 202 with wires 206.

Further, the concave portion is filled with a transparent sealing resin 204.

Further, a surface of the sealing resin 204 serves as the emitting surface 204a.

The shape of the emitting surface 204a seen from the top view of FIG. 5(c) is not limited to a rectangular, and may be a polygon or ellipse.

Further, it is preferable that the emitting surface 204a be substantially plane. This enables an incident angle θi (described later) to be more accurate, thereby improving light extraction efficiency.

Note that, FIG. 5(c) is a plan view seen from over the emitting surface 204a.

FIG. 6(a) is a cross sectional view of the chip 202, and FIG. 6(b) is a view showing emission characteristics of the chip 202. Each emission angle indicates an angle formed with normal to the chip 202.

The chip 202 is a junction up chip including the light emitting section, i.e., the active layer 202a, which is provided in the vicinity of the top surface of the chip 202 at a height h from the bottom surface of the chip 202.

Further, the active layer 202a is normally provided in parallel to the bottom surface of the chip 202.

The chip 202 emits light such that light emitted with an emission angle of 0° achieves a peak intensity. Thus, the greater the emission angle is, the more moderate the intensity becomes gradually.

Figure 7:
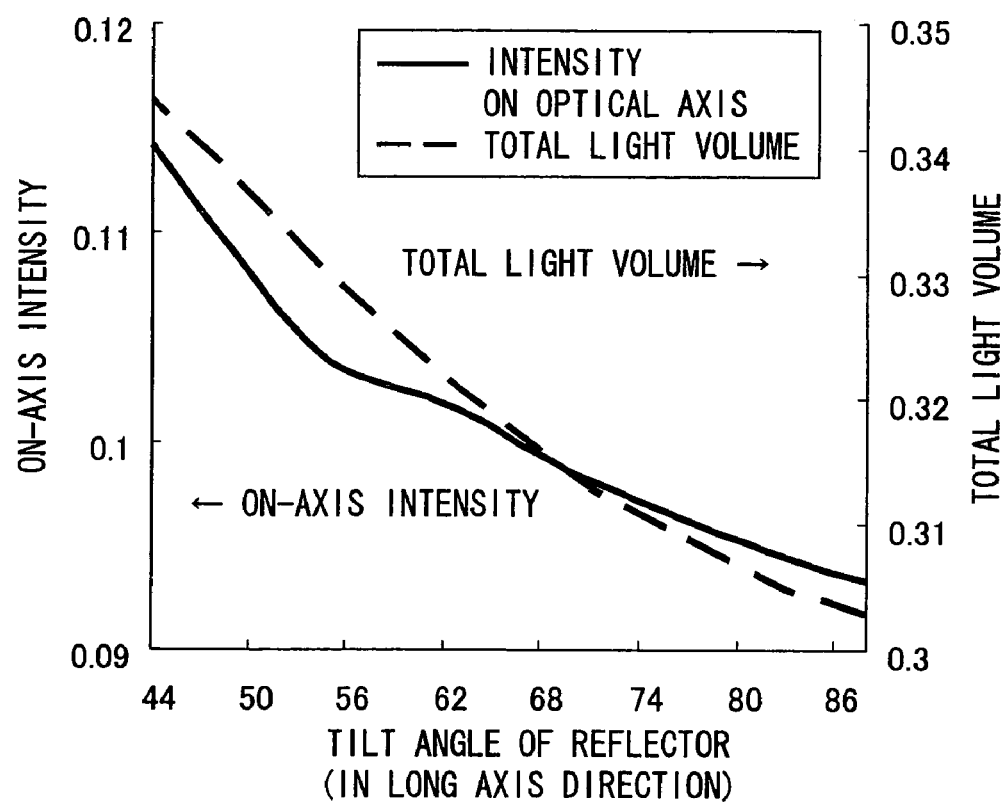
FIG. 7 is a view showing variations in light volume when a tilt angle of a reflector is varied.

FIG. 7 is a view showing a light volume of the light emitting device, when the chip 202, i.e., a junction up chip, is disposed in a package in which a reflection surface (i.e., a side wall) of the reflector 203 in the long axis direction forms a single tilt angle with the bottom surface of the concave portion, and when the tilt angle is varied.

According to FIG. 7, the more moderate tilt angle the side wall forms, the larger light volume is achieved.

That is, in the light emitting device employing the chip, i.e., a junction up chip, the more moderate the tilt angle is, the higher light extraction efficiency is achieved.

The reason for this is considered as follows. Assume a case where the gentle slope surface forms a moderate tilt angle. In this case, when light emitted mainly from the side surface of the chip is reflected by the gentle slope surface and directed to the emitting surface, more components of the light are incident on the emitting surface with an angle of not greater than the critical angle. This reduces total reflection of the light at the emitting surface, thereby improving light extraction efficiency. In this regard, details will be described later.

In the present embodiment, however, setting the more moderate tilt angle while maintaining the width w of the package 201 to be a certain width gives rise to a problem that the width d of the wire bonding regions cannot be ensured, because the bottom surface of the chip 202 becomes closer to the gentle slope surface 203d.

Regardless of this problem, the wire bonding regions are ensured in the vicinity of the chip 202 by providing the depressed region in the concave portion and disposing the chip 202 on the bottom surface 203e of the depressed region.

Further, since the chip 202, i.e., a junction up chip, has a higher refractive index than that of the sealing resin 204, almost no light is emitted from a portion of the side surface of the chip 202, specifically from a portion of the surface extending between the active layer 202a and the bottom surface of the chip 202.

Thus, even in a case where the depressed region is provided in the concave portion as shown in FIG. 5(a), light extraction efficiency is not so degraded when the depressed region has a depth being substantially equivalent to or less than the height h of the active layer 202a.

This enables the width d of the wire bonding region to be ensured without degrading light extraction efficiency.

As such, in order to ensure the width d of the wire bonding regions while maintaining a tilt angle θ formed with the gentle slope surface 203d to be not greater than 66°, it is advantageous to arrange the chip 202 such that the active layer 202a is provided at a position closer to the top surface of the chip 202 than to the substantially center part of the chip 202.

Figure 8:
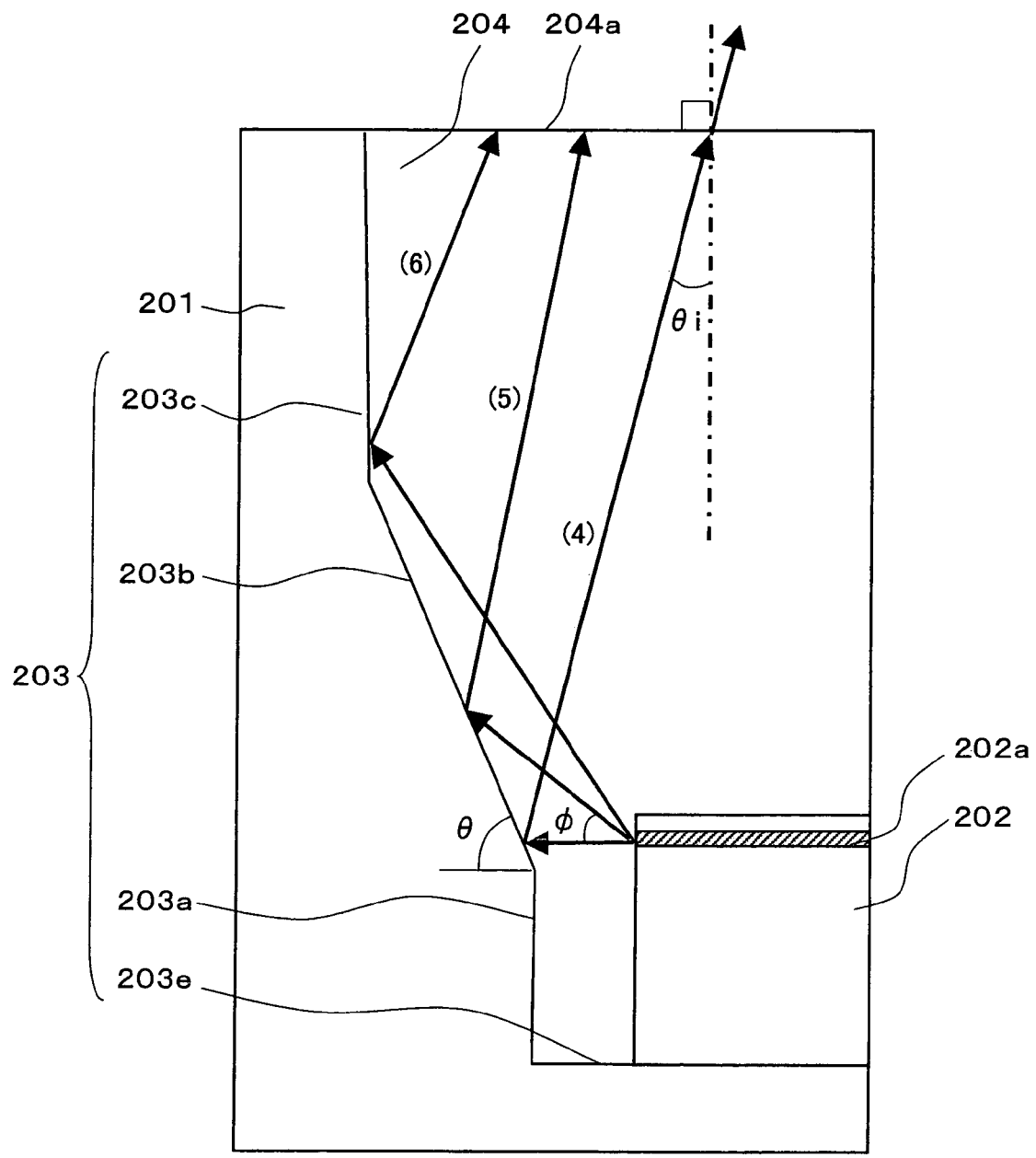
FIG. 8 is a view showing optical paths of the light emitting device according to another embodiment of the present invention.
Figure 9:
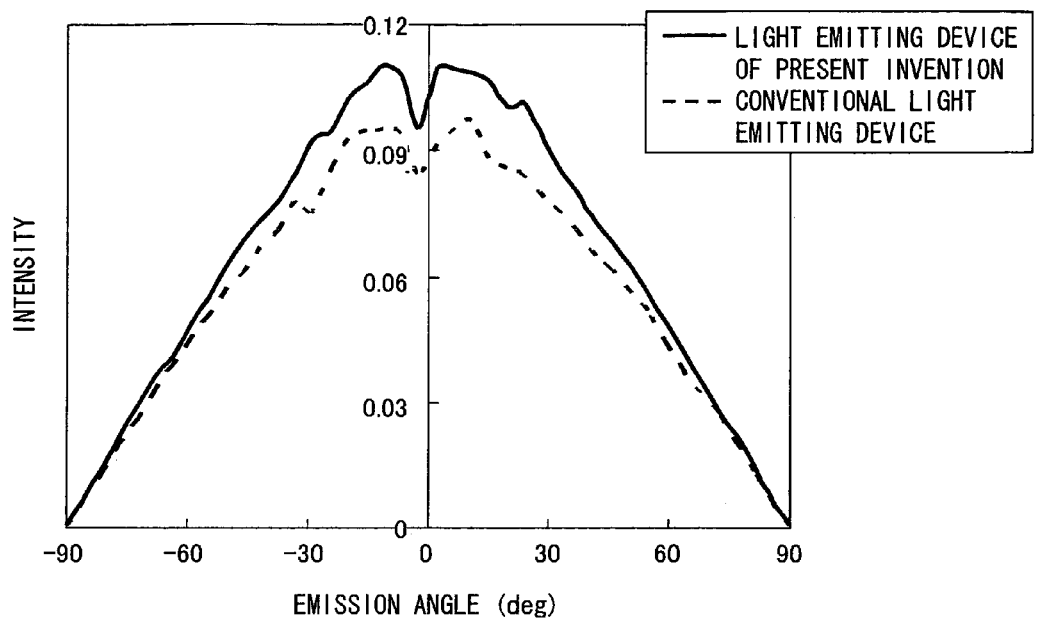
FIG. 9(a) is a view showing emission characteristics of light emitting devices in their short axis direction, based on comparison made with regard to intensity between the light emitting device according to another embodiment of the present invention and a conventional light emitting device.
FIG. 9(b) is a view showing emission characteristics of light emitting devices in their long axis direction, based on comparison made with regard to intensity between the light emitting device according to another embodiment of the present invention and the conventional light emitting device.
Figure 9:
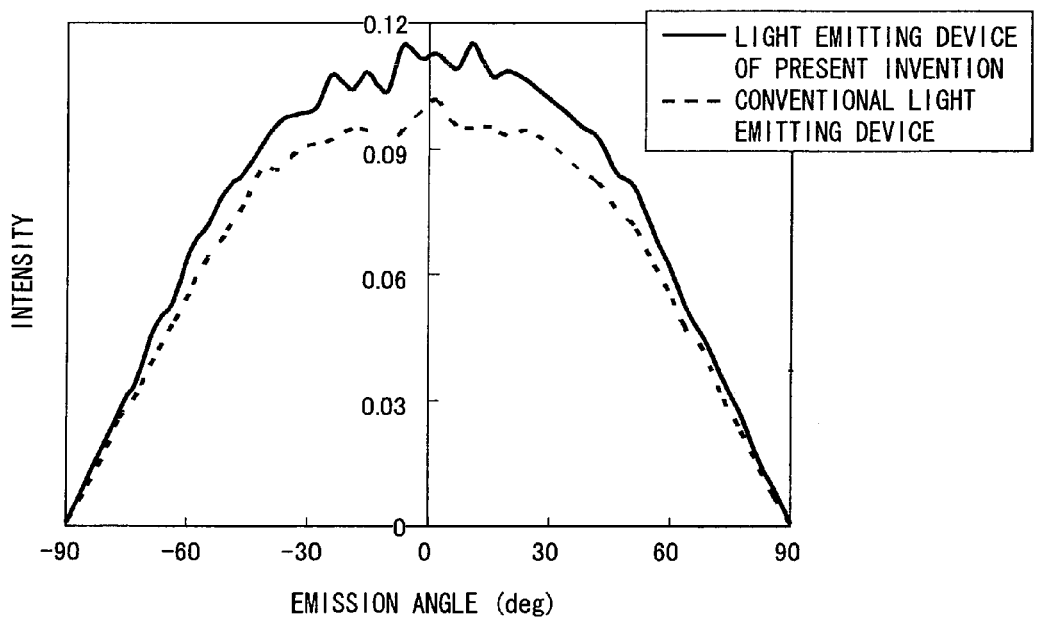

FIG. 8 is a view showing optical paths of the light emitting device according to the present embodiment.

Note that, FIG. 8 is an enlarged view of one side of the side wall of the reflector 203 in the short axis direction.

Light emitted mainly from the side surface of the chip 102 is reflected by the reflector 203, incident on the emitting surface 204a with an incident angle θi, and emitted to air.

In a case where light propagates from a medium with a high refractive index to a medium with a low refractive index, if an incident angle θi is greater than a certain angle, total reflection of the light occurs at the boundary between the mediums. The angle of the total reflection is called a critical angle.

Thus, as the incident angle formed with the boundary of the mediums approaches a vertical angle with respect to the boundary, the reflection becomes minimum, enabling the light extraction efficiency to be maximum.

The sealing resin 204 has a refractive index n of about 1.5, when the sealing resin 104 is made of a material commonly used in this field. When a refractive index n of air is set to 1, the critical angle is about 42°. That is, when the incident angle θi is not greater than about 42°, the total reflection becomes minimum, enabling the light extraction efficiency to be maximum.

Referring to FIG. 8, the following describes optical paths (4) through (6) of light emitted from the side surface of the chip 202. In the following description, an elevation angle formed with the active layer 202a is φ.

Note that, the optical paths (4) through (6) correspond to emission characteristics (4) through (6) of light having high intensities shown in FIG. 6(b).

Thus, the optical path (4) is a path for light emitted with an elevation angle φ of about 0, i.e., when the light is emitted in substantially parallel to the active layer 202a. In other words, light propagating in the optical path (4) corresponds to light emitted with an emission angle of 90° shown in FIG. 6(b).

In this case, the light is reflected by the gentle slope surface 203b, and incident on the emitting surface 204a with an incident angle θi of not greater than about 42°. This causes almost no total reflection at the emitting surface 204a.

The optical path (5) is a path for light emitted with a moderate elevation angle, i.e., an emission angle of about 70°.

In this case, the light is reflected by the gentle slope surface 203b with a more moderate angle than an angle formed by the optical path (4). This causes the incident angle θi of the optical path (5) to be shallower than that of the optical path (4). Thus, no total reflection occurs also in this case.

The optical path (6) is a path for light emitted with a sharper elevation angle than an angle formed by the optical path (5), i.e., an emission angle of about 40°.

In this case, although the light is reflected by the steep slope surface 203c, it is possible for most components of the light to be incident on the emitting surface 204a with an incident angle θi of not greater than about 42°. This causes almost no total reflection also in this case.

In a case where the light is emitted with a further sharper elevation angle, the light is either reflected by the steep slope surface 203c or directly incident on the emitting surface 204a. In either case, the incident angle θi can be set to be not greater than about 42°, causing almost no total reflection.

As such, in the reflector 203 having: the gentle slope surface 203b forming a tilt angle of not greater than 66°; and the steep slope surface 203c, most components of light emitted from the chip 202 with an emission angle ranging from 0° to 90° are guided so as to be incident on the emitting surface 204a with an incident angle θi of not greater than about 42°.

Note that, the tilt angle θ of the gentle slope surface 203b is not limited to an angle of not greater than 66°, and should be suitably adjusted according to the refractive index of the sealing resin 204. That is, it is only required, when light emitted mainly from the side surface of the chip 202 is reflected by the gentle slope surface 203b and incident on the emitting surface 204a with an incident angle θi, that the incident angle θi is not greater than the critical angle and no total reflection occurs.

On the other hand, in the short axis direction, if the side wall of the reflector 203 is constituted by only a gentle slope surface 203b, the package 201 has an increased thickness t. However, by setting the side wall to have a steep slope surface from a certain point as described above, it is possible to cause components of light emitted with a moderate elevation angle to be incident on the emitting surface 204a without causing total reflection at the emitting surface 204a. With the above structure, the package 201 is made more flat than the reflector 203, realizing a reduction in thickness of the package 201.

The sharper tilt angle the steep slope surface 203c has, the less thickness t can be set. In this case, however, since the incident angle θi formed with the emitting surface 204a is increased, more components of the light are totally reflected, with the result that efficiency of guiding the light is deteriorated. Further, more components of the light are incident again on a steep slope surface facing the steep slope surface 203c, with the result that efficiency of guiding the light is deteriorated. Considering such problems, it is important to form the steep slope surface 203c to have a tilt angle providing a good balance between the thickness t and the efficiency of guiding the light.

Note that, the same principle as is the case with the short axis direction is applied to the tilt angle θ formed with the gentle slope surface 203d in the long axis direction of the reflector 203. That is, the gentle slope surface 203d in the long axis direction is set so as to have a tilt angle θ of not greater than 66°, in order that an incident angle θi formed with the emitting surface 204a is set to be not greater than 42° to suppress the total reflection and to improve the efficiency of guiding the light.

Note that, in the long axis direction of the reflector 203, the package 201 has a width w being substantially larger than the thickness t. This provides a large design margin.

Thus, in the long axis direction, the side wall of the reflector 203 may be constituted by a single inclined plane forming a tilt angle θ of not greater than 66°, or by i) a gentle slope surface forming a tilt angle of not greater than 66° and ii) a steep slope surface.

This realizes a reduction in width w of the package 201.

Note that, the interface between the depressed region and the gentle slope surface 203b or 203d, or the interface between the gentle slope surface 203b and the steep slope surface 203c may be a smooth surface, created by varying the tilt angle continuously.

In the following, comparison is made with regard to emission characteristics between (i) a conventional light emitting device in which a gentle slope surface 203d of a reflector 203 in its long axis direction forms a single tilt angle of 88° with a bottom surface 203e and (ii) the light emitting device according to the present embodiment in which the gentle slope surface 203d of the reflector 203 in the long axis direction forms a single tilt angle of not more than 66° (e.g. 49°) with the bottom surface 203e. Note that, a reflection surface in the short axis direction forms a single tilt angle of 78° with the bottom surface 203e. Further, a chip 202 is a junction up chip as is the case with the chip 202 according to the present embodiment.

FIGS. 9(a) and 9(b) are views showing results of the comparison made with regard to intensity between the conventional light emitting device and the light emitting device according to the present embodiment. FIGS. 9(a) and 9(b) show characteristics in light emission in the short axis direction and in the long axis direction, respectively.

It is understood that the light emitting device according to the present embodiment improves intensity of light emitted within the entire emission angle, compared to that of the conventional light emitting device.

It is preferable that the light emitting element have a side wall being inclined, for example, from its bottom surface to its top surface.

Further, it is preferable that a reflection surface having a gentle slope surface reflect components of light emitted mainly from a side surface of the light emitting element.

Further, it is preferable that the gentle slope surface form an angle of not greater than 66° with the active layer.

Further, it is preferable that the emitting surface be substantially plane.

Further, it is preferable that the emitting surface have a shape of a rectangular, a polygon having a long axis and a short axis, or an ellipse.

Further, it is preferable that a side wall of the concave portion have at least in the short axis direction have a reflection surface having a gentle slope surface and a steep slope surface, which are provided in this order from a bottom surface of the concave portion.

Further, it is preferable that an interface between the gentle slope surface and the steep slope surface be provided at a position closer to an emitting surface of a light emitting device than to a top surface of a light emitting element.

Further, it is preferable that the interface between the gentle slope surface and the steep slope surface have a curved surface.

Further, it is preferable that, in the long axis direction of the package body, the inclined plane form an angle of not greater than 66° with the active layer.

Further, it is preferable that the inclined plane include a gentle slope surface and a steep slope surface in the long axis direction of the package body, the gentle slope surface forming an angle of not greater than 66° with the active layer, and that the gentle slope surface and the steep slope surface be provided in this order from an interface between the depressed region and the inclined plane.

Further, it is preferable that the package body further include a reflection surface being an inclined plane provided along a long side of the depressed region toward the emitting surface, when seen from above the emitting surface, and that the depressed region have a depth being substantially equal to or less than a height of the active layer of said light emitting element.

Further, it is preferable that, in the short axis direction of the package body, the inclined plane form an angle of not greater than 66° with the active layer.

Further, it is preferable that the inclined plane include, in the short axis direction of the package body, a gentle slope surface and a steep slope surface, the gentle slope surface forming an angle of not greater than 66° with the active layer, and that the gentle slope surface and the steep slope surface be provided in this order from an interface between the depressed region and the inclined plane.

Further, it is preferable that the emitting surface be substantially plane.

Further, the interface between the depressed region and the gentle slope surface, or the interface between the gentle slope surface and the steep slope surface have a curved surface.

According to the arrangement, components of light emitted mainly from the side surface of the chip are reflected by the gentle slope surface of the reflector so that total reflection of the light is suppressed at the emitting surface, i.e., the boundary between the sealing resin and air. This enables the light to be extracted efficiently. Further, by providing the steep slope surface from a certain point of the gentle slope surface, a package is realized in a thin body.

That is, the reflection surface including the gentle slope surface and the steep slope surface enables a reduction in thickness of the package. Further, light emitted mainly from the side surface of the light emitting element is reflected by the gentle slope surface, and incident on the emitting surface with an incident angle being smaller than the critical angle. This improves light extraction efficiency.

Further, according to the arrangement, the light emitting device employs a chip including the active layer provided at a certain height from the bottom surface. In the light emitting device, the wire bonding region can be enlarged by providing the depressed region in the concave portion. This allows use of a chip in which wire bonding is easily performed and which is large in size and in light volume.

Further, among components of light emitted from the chip including the active layer formed at a position between the substantially center part of the chip and the vicinity of the top surface of the chip, most components of the light emitted at least from portion(s) closer to the top surface than to the active layer are reflected by the gentle slope surface of the reflector. This improves light extraction efficiency.

Further, by providing the steep slope surface from a certain point of the gentle slope surface, the package is realized in a thin body.

As a result, a light emitting device is provided which is excellent in efficiently extracting light emitted from the chip, regardless of such a thin body.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A light emitting device, comprising:
    a light emitting element; and
    a package body in which said light emitting element is contained and a concave portion is formed,
    the concave portion having a bottom surface on which said light emitting element is disposed and being filled with a transparent sealing resin for covering said light emitting element,
    the sealing resin having with air a boundary serving as an emitting surface, from which light is extracted,
    said light emitting element including an active layer formed at a position between a substantially center part of said light emitting element and a bottom surface of said light emitting element and emitting light so as to achieve, as an emission characteristic, a strong peak intensity at an emission angle with respect to a line normal to said light emitting element in a range from 40° to 60°, and
    the concave portion having a reflection surface including a gentle slope surface and a steep slope surface steeper than the gentle slope surface, which are provided in this order from the bottom surface of the concave portion.

2. The light emitting device according to claim 1, wherein said light emitting element has the side surface being inclined from the bottom surface of said light emitting element toward a top surface of said light emitting element.

3. The light emitting device according to claim 1, wherein the reflection surface including the gentle slope surface reflects components of light emitted mainly from the side surface of said light emitting element.

4. The light emitting device according to claim 1, wherein the gentle slope surface forms an angle of not greater than 66° with the active layer.

5. The light emitting device according to claim 1, wherein the emitting surface is substantially planar.

6. The light emitting device according to claim 1, wherein the emitting surface has a shape of a rectangle, a polygon having a long axis and a short axis, or an ellipse.

7. The light emitting device according to claim 6, wherein the concave portion has a reflection surface on its side wall at least in a short axis direction of the concave portion, the reflection surface including the gentle slope surface and the steep slope surface, which are provided in this order from the bottom surface of the concave portion.

8. The light emitting device according to claim 1, wherein an interface between the gentle slope surface and the steep slope surface is closer to the emitting surface of said light emitting device than to a top surface of said light emitting element.

9. The light emitting device according to claim 1, wherein an interface between the gentle slope surface and the steep slope surface has a smooth surface.

* * * * *